(12) United States Patent
Yamasaki

(10) Patent No.: US 6,657,879 B2
(45) Date of Patent: Dec. 2, 2003

(54) SEMICONDUCTOR INTEGRATED CIRCUIT DEVICE WITH NOISE FILTER

(75) Inventor: Kyoji Yamasaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 24 days.

(21) Appl. No.: 10/226,353

(22) Filed: Aug. 23, 2002

(65) Prior Publication Data

US 2003/0039136 A1 Feb. 27, 2003

(30) Foreign Application Priority Data

Aug. 27, 2001 (JP) .................................... 2001-255651

(51) Int. Cl.[7] .................................................. G11C 5/06
(52) U.S. Cl. .................................... 365/63; 365/230.03
(58) Field of Search ............................. 365/63, 51, 52, 365/230.03

(56) References Cited

U.S. PATENT DOCUMENTS 6,208,548 B1 * 3/2001 Kawagoe .................... 365/63
6,452,826 B1 * 9/2002 Kim et al. .................... 365/51
6,480,409 B2 * 11/2002 Park et al. .................... 365/63

FOREIGN PATENT DOCUMENTS

| JP | 5-122006 | 5/1993 |
| JP | 7-58588 | 3/1995 |
| JP | 8-340236 | 12/1996 |

* cited by examiner

*Primary Examiner*—Anh Phung

(57) ABSTRACT

A memory controller is configured with a PLD, and includes an input pin for receiving an input of a control signal from the outside of a memory module, and input pin terminals for receiving inputs of electric signals. The memory controller controls the operation of a plurality of memory units in response to a control signal that has been passed through a filter circuit capable of adjusting cutoff frequency depending on the electric signals. Thus, noise is removed without modifying the design of the filter circuit depending on the system in which the memory module is incorporated.

9 Claims, 5 Drawing Sheets

CONTROL SIGNAL (FROM SYSTEM CONTROLLER)

CONTROL SIGNAL (FROM SYSTEM CONTROLLER)

SEMICONDUCTOR INTEGRATED CIRCUIT DEVICE WITH NOISE FILTER

BACKGROUND OF THE INVENTION

1. Field of the Invention

This invention relates to a semiconductor integrated circuit device, and more specifically, to a semiconductor integrated circuit device with a noise filter for removing noise of an input signal.

2. Description of the Background Art

In order to meet the demand for a semiconductor memory of large capacity and high speed, a semiconductor integrated circuit device with a plurality of memory units and a memory controller for controlling accesses to the memory unit, referred to as a memory module, has been developed.

FIG. 8 is a schematic block diagram showing a configuration of a memory module according to the conventional technique.

Referring to FIG. 8, a memory module 100 according to the conventional technique includes a plurality of memory units 102, a memory controller 104, and a plurality of connector terminals 106.

Each of the memory units 102 is, for example, configured with a Dynamic Random Access Memory (DRAM), and is capable of executing reading and writing data independent of each other.

The memory controller 104 controls the operation of the plurality of memory units 102 in response to a control signal from the outside of the memory module, for example from a system controller (not shown), to control the overall system in which the memory module is integrated. The memory controller 104 is, for example, configured with a Programmable Logic Device (PLD) and generates a memory control signal MCS to control the operation of the plurality of memory units 102 in response to a control signal input to an input pin P0. Each of the memory units 102 operates in response to the memory control signal MCS.

Each of the connector terminals 106 is capable of sending and receiving signals to and from the outside of the memory module.

In FIG. 8, one connector terminal 106a of the plurality of connector terminals is used to show an input path of a control signal input from the system controller to a memory controller 104.

A noise filter 108 is placed between the connector terminal 106a to which a control signal is input and an input pin P0 of the memory controller 104. The noise filter 108 removes high frequency components from the signal input to the connector terminal 106a by means of a low pass filter composed of a resistance element 109 and a capacitor 110, and sends the signal to the input pin P0. Thus, noise superposed onto the control signal due to an impedance mismatch of an interconnection or the like can be suppressed.

FIG. 9 is a circuit diagram showing a configuration of an input first stage circuit in a memory controller in accordance with the conventional technique.

Referring to FIG. 9, the input first stage circuit 105 of the conventional memory controller 104 has inverters IV1 and IV2 for receiving a control signal that has been passed the noise filter 108 and sent to the input pin P0. Thus, a signal that is of the same phase with the control signal that has been removed of the high frequency noise by the noise filter 108 can be sent into the memory controller.

In the memory module according to the conventional technique such as shown in FIG. 8, however, it is required to design the noise filter 108 every time to conform to the system in which the memory module is incorporated. Particularly, it is highly required to design the capacitance of the capacitor 110 in the noise filter 108 at the optimal value since it may lead to transmission delay, i.e. to an increase of the access time to the memory module.

Accordingly, it has been necessary to tune the constant of elements of the noise filter that matches to the system, while evaluating on an actual device with the memory module actually incorporated into the system. In other words, there has been a problem that the noise filter can not be designed for general purpose and thus aggravating the burden for designing the same.

SUMMARY OF THE INVENTION

The objective of the present invention is to design a noise filter for input signals easily in a semiconductor integrated circuit device represented by a memory module.

A semiconductor integrated circuit device according to the present invention includes a plurality of connector terminals for externally sending and receiving signals, a plurality of internal circuits, and a control circuit for controlling the operation of the plurality of operations based on the prescribed logic operation responding to the control signal having been input to one of the plurality of connector terminals. The control signal includes a first pin terminal for receiving an input of a control signal, a second pin terminal for receiving an input of an electric signal, a filter circuit for attenuating components superposed onto the signal input to the first pin terminal in a prescribed frequency range that varies depending on the electric signal input to the second pin terminal, and a logic operation circuit for performing the prescribed logic operation in response to the control signal passing the filter circuit.

Such a semiconductor integrated circuit device is capable of adjusting the frequency characteristic of the filter circuit that act as a noise filter, in response to the electric signal input to the pin terminal of the control unit. Accordingly, noise can effectively be removed without modifying the design of the filter circuit so as to conform to the system in which the semiconductor integrated circuit device is incorporated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
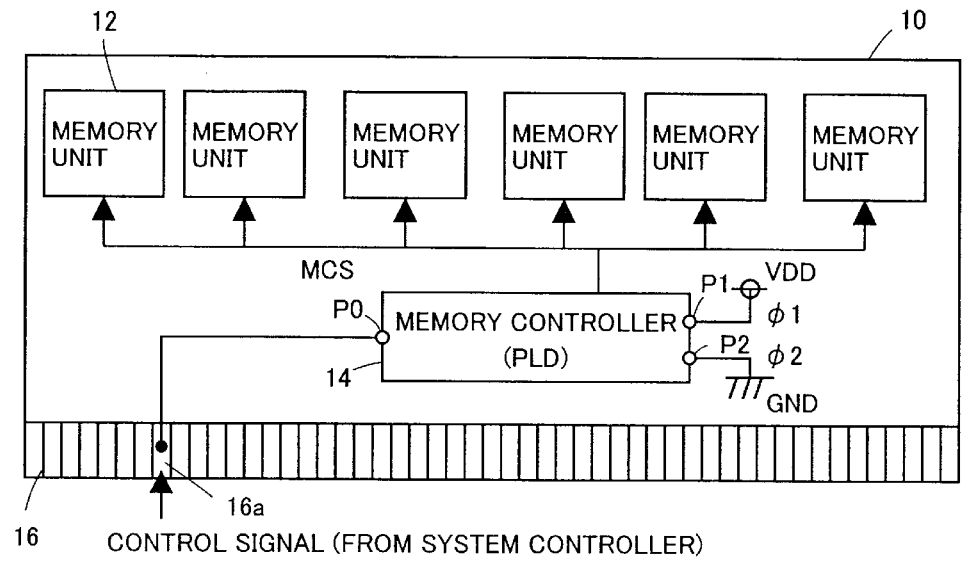
FIG. 1 is a schematic block diagram showing an overall configuration of a memory module illustrated as a representative example of a semiconductor integrated circuit device according to a first embodiment of the present invention.

In the following, embodiments of the present invention are described in detail referring to the drawings. In the drawings, the same reference characters refer to identical or similar parts.

Further, in the following, a memory module is shown as a representative example of a semiconductor integrated circuit device according to the present invention. As would be apparent from the description below, however, the application of the present invention is not limited to the memory module, but the present invention is applicable to any semiconductor integrated circuit devices that operate in response to input signals.

First Embodiment

Referring to FIG. 1, a memory module 10 according to a first embodiment includes a plurality of memory units 12, a memory controller 14, and a plurality of connector terminals 16.

Figure 8:
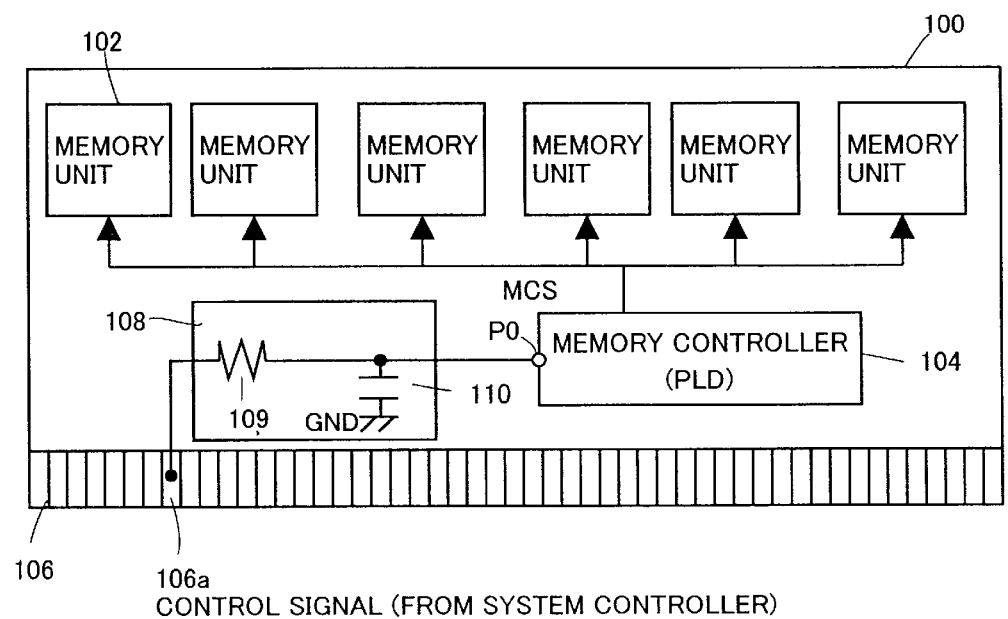
FIG. 8 is a schematic block diagram showing a configuration of a memory module according to a conventional technique.
Figure 9:
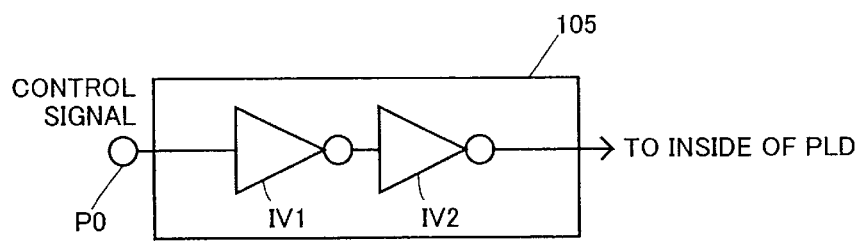
FIG. 9 is a circuit diagram showing a configuration of a first input stage circuit in a memory controller according to a conventional technique.

Each of the memory units 12 corresponds to the memory unit 102 shown in FIG. 8, and configured, for example, with Dynamic Random Access Memory (DRAM). Each of the memory units 12 is capable of executing reading and writing data independently, and operates in response to the memory control signal MCS.

Memory controller 14 corresponds to the memory controller 104 shown in FIG. 8, and generates memory control signal MCS for controlling the operation of the plurality of memory units 12 in response to the control signal provided from the outside of the memory module, for example, from a system controller which is not shown in the figure. Memory controller 14 is representatively configured with a PLD. PLD is programmed with the control logic operation to be executed by the memory controller in response to the control signal.

As has been described, with the memory controller for controlling the operation of the plurality of memory units, each of the memory units can effectively be operated to accelerate input or output data to and from the memory module. Additionally, compared to the configuration in which an operation control logic is placed in each of the memory units, chip area and the number of signal wiring can be reduced.

Memory controller 14 has a plurality of input pins for sending and receiving signals. In FIG. 1, among these input pins, an input pin P0 for receiving a control signal input to the connector terminal 16a, and input pins P1 and P2 for receiving electric signals $\phi1$ and $\phi2$ respectively for adjusting the frequency characteristic of the noise filter provided inside of the memory controller (PLD) are shown representatively.

In the configuration of FIG. 1, the input pins P1 and P2 are electrically coupled to power supply voltage VDD and ground voltage GND, respectively. In other words, power supply voltage VDD and ground voltage GND are provided as electric signals $\phi1$ and $\phi2$, respectively.

Each of the connector terminals 16 is capable of sending and receiving electric signals within the system in which the memory module is incorporated, or to and from the outside of the system. For example, for the connector terminal 16a among these connector terminals a control signal for controlling the operation of the memory unit 12 is to be provided from the outside of the memory module, from the system controller representatively.

In the memory module 10 according to a first embodiment, the noise filter is not placed on the input stage of the memory module directly corresponding to the connector terminals 16, but is mounted on the input first stage of the PLD as one of the programmable function in the PLD.

Figure 2:
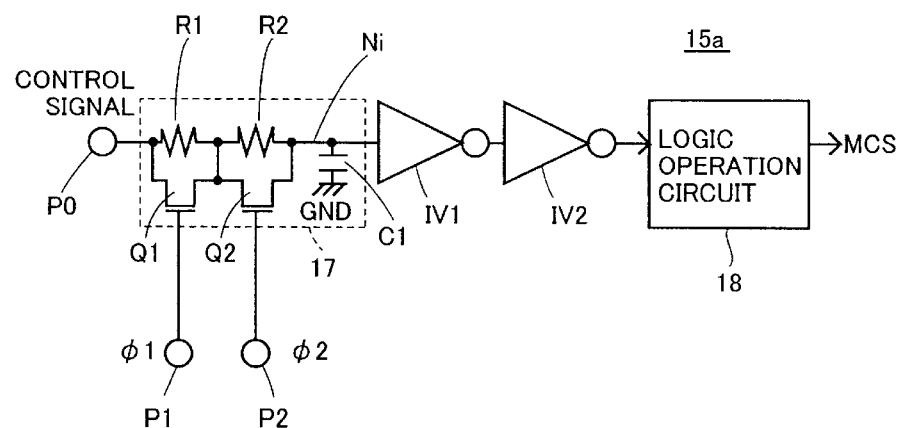
FIG. 2 is a circuit diagram showing an example of a configuration of an input first stage circuit of a memory controller according to the first embodiment.

Referring to FIG. 2, an input first stage circuit 15 of the memory controller according to the first embodiment has a low pass filter 17, inverters IV1 and IV2, and a logic operation circuit 18.

The low pass filter 17 provided as a noise filter has resistance elements R1 and R2 that are connected in series between the input pin P0 to which a control signal is transmitted and a node Ni, and a capacitor C1 coupled between the node Ni and the ground voltage GND.

The low pass filter 17 further has transistor switches Q1 and Q2 connected in parallel to the resistance elements R1 and R2, respectively. The gate of the transistor switch Q1 is connected to the input pin P1 for receiving the electric signal $\phi1$. The transistor switch Q1 forms a bypass path of the resistance element R1 when turned on in response to the electric signal $\phi1$. Similarly, the gate of the transistor switch Q2 is connected to the input pin P2 for receiving the electric signal $\phi2$. The transistor switch Q2 forms a bypass path of the resistance element R2 when turned on in response to the electric signal $\phi2$.

The cutoff frequency of the low pass filter 17 is determined by the product of the resistance component and the capacity component (C1), the resistance component in the low pass filter being changeable stepwise depending on the electric signals $\phi1$ and $\phi2$. In other words, in response to the electric signals $\phi1$ and $\phi2$, the resistance value of the resistance component can be set at four stages of approximately zero, R1, R2 and (R1+R2). As a result, in response to electric signals $\phi1$ and $\phi2$ applied to the input pins P1 and P2, the frequency characteristic of the low pass filter 17 which act as a noise filter can be adjusted stepwise.

It is merely the way of example that the number of the resistance elements and the transistor switches connected in parallel thereto has been described as two each, and it is also possible to provide an optional plurality of resistance elements and corresponding numbers of transistor switches. A resistance element without a transistor switch for forming a bypass path may also be provided.

The node Ni is provided with a control signal that is removed of the high frequency noise by the low pass filter 17. Inverters IV1 and IV2 drive the signal, transmitted to the node Ni, to the logic operation circuit 18.

The logic operation circuit 18, in response to the control signal that passed the low pass filter 17, executes the programmed prescribed logic operation to generate a memory control signal MCS.

Figure 3:
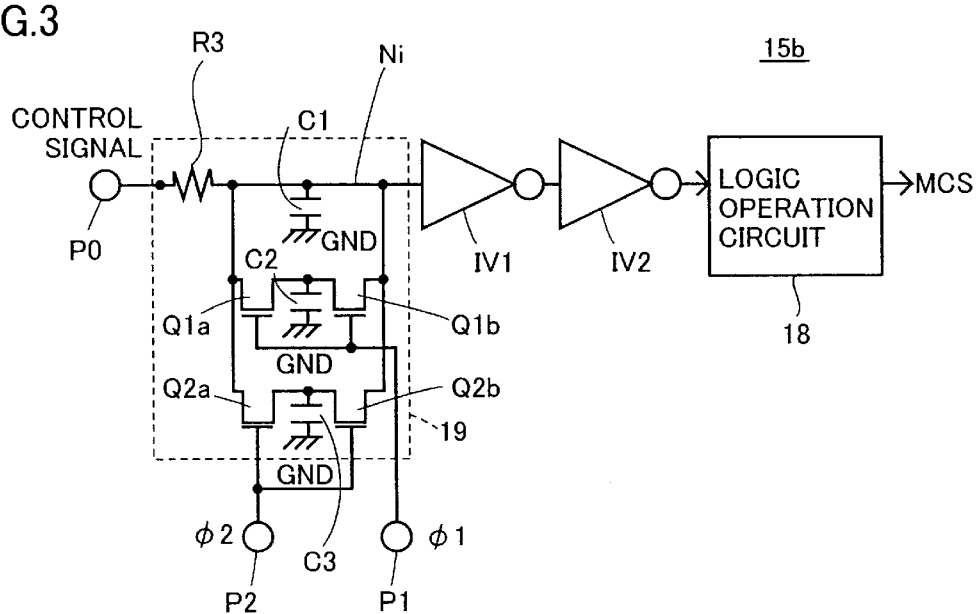
FIG. 3 is a circuit diagram showing another example of a configuration of an input first stage circuit of a memory controller according to the first embodiment.

Referring to FIG. 3, an input first stage circuit 15b according to another illustrative configuration of the embodiment 1 has a low pass filter 19, inverters IV1 and IV2, and a logic operation circuit 18. The low pass filter 19 has a resistance element R3 connected between the input pin P0 and the node Ni, a capacitor C1 connected between the node Ni and the ground voltage GND, capacitors C2 and C3, and transistor switches Q1a, Q1b, Q2a, and Q2b.

Gates of the transistor switches Q1a and Q1b are each coupled to the input pin P1. Gates of the transistor switches Q2a and Q2b are each coupled to the input pin P2. Therefore, when the transistor switches Q1a and Q1b turn on in response to the electric signal $\phi1$, the capacitor C2 is coupled to the node Ni in parallel to the capacitor C1. Similarly, when the transistor switches Q2a and Q2b turn on in response to the electric signal $\phi2$, the capacitor C3 is coupled to the capacitor C1 in parallel to the node Ni.

Accordingly, the capacitance value applied to the node Ni can be switched at four stages of C1, (C1+C2), (C1+C3), and (C1+C2+C3) in response to the electric signals 4)1 and 42 applied to the input pins P1 and P2.

Accordingly, similar to the input first stage circuit 15a shown in FIG. 2, the frequency characteristic of the low pass filter 19 that act as a noise filter can be adjusted stepwise in response to the electric signals $\phi1$ and $\phi2$ applied to the input pins P1 and P2.

Further, the configurations of the input first stage circuits 15a and 15b may be combined to achieve a configuration in which the resistance component and capacity component are respectively adjustable.

With such configuration, by selectively coupling the input pin of the memory controller configured with PLD designed for general purpose to the power supply node (the power supply voltage VDD or the ground voltage GND), the frequency characteristic of the noise filter can be adjusted to conform to the system in which the memory module 10 is incorporated. Thus, without modifying the design on the memory module basis in consideration of the overall system in which the memory module is incorporated, the noise filter that effectively removes noise can easily be designed.

Second Embodiment

Figure 4:
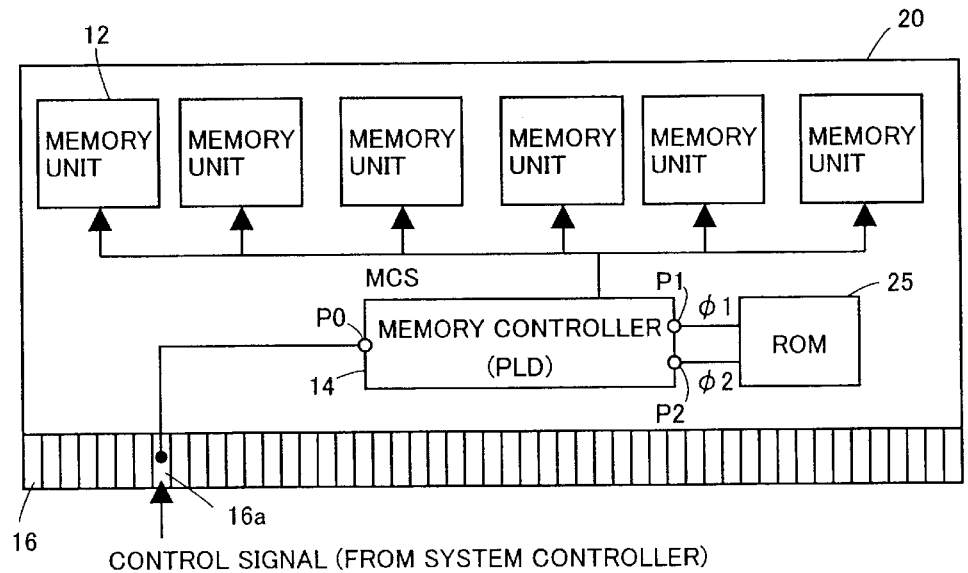
FIG. 4 is a schematic block diagram showing an overall configuration of a memory module according to a second embodiment.

Referring to FIG. 4, a memory module 20 according to a second embodiment is different from the memory module 10 shown in FIG. 1 in that it further includes a storage unit 25. Since the configuration of the other portions is similar to that of the memory module 10 in FIG. 1, detailed description is not repeated.

The storage unit 25 is, for example, configured with a Read Only Memory (ROM). The storage unit 25 outputs data stored in a non-volatile manner that correspond to the electric signals $\phi1$ and $\phi2$ to the input pins P1 and P2, respectively. That is, the electric signals $\phi1$ and $\phi2$ are set to the power supply voltage VDD ("H" level) or the ground voltage GND ("L" level), depending on the data stored in the storage unit 25.

With such configuration, by writing the storage data of the storage unit 25, the frequency characteristic of the noise filter in the input first stage circuit of the memory controller 14 can easily be adjusted so as to conform to the system in which the memory module 20 is incorporated. Particularly, compared to the configuration in which the input pins P1 and P2 are directly connected with the power supply voltage node as in the first embodiment, the electric signals $\phi1$ and $\phi2$ can be set easier.

Third Embodiment

Figure 5:
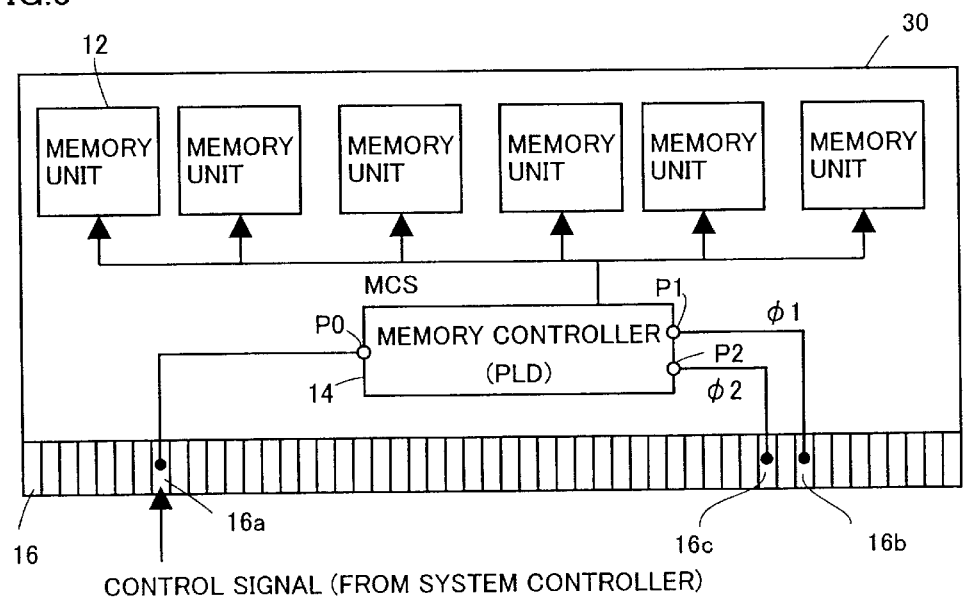
FIG. 5 is a schematic block diagram showing an overall configuration of a memory module according to a third embodiment.

Referring to FIG. 5, a memory module 30 according to a third embodiment is different from the memory module 10 shown in FIG. 1 in that the electric signals $\phi1$ and $\phi2$ for adjusting the frequency characteristic of the noise filter mounted on the input first stage circuit of the memory controller 14 can be input from the outside of the memory module (e.g., system controller) via a connector terminal 16. Since the configuration of other portions is similar to that of the memory module 10 in FIG. 1, detailed description is not repeated.

In FIG. 5, a configuration is shown in which the electric signals $\phi1$ and $\phi2$ are input via the connector terminals 16b and 16c, respectively.

With such configuration, in response to the electric signals that can be input from the outside of the memory module to the connector terminals, the frequency characteristic of the noise filter can easily be adjusted so as to conform to the system in which the memory module 30 is incorporated.

Variation of the Third Embodiment

As shown in the third embodiment, in order to input the electric signals for switching the frequency characteristic of the noise filter via the connector terminal, large number of electric signals and connector terminals for inputting these electric signals are required to ensure many adjustable stages. Accordingly, in a variation of the third embodiment, a configuration in which these signals can be input from the outside of the memory module, for example from the system controller, using smaller number of connector terminals is described below.

Figure 6:
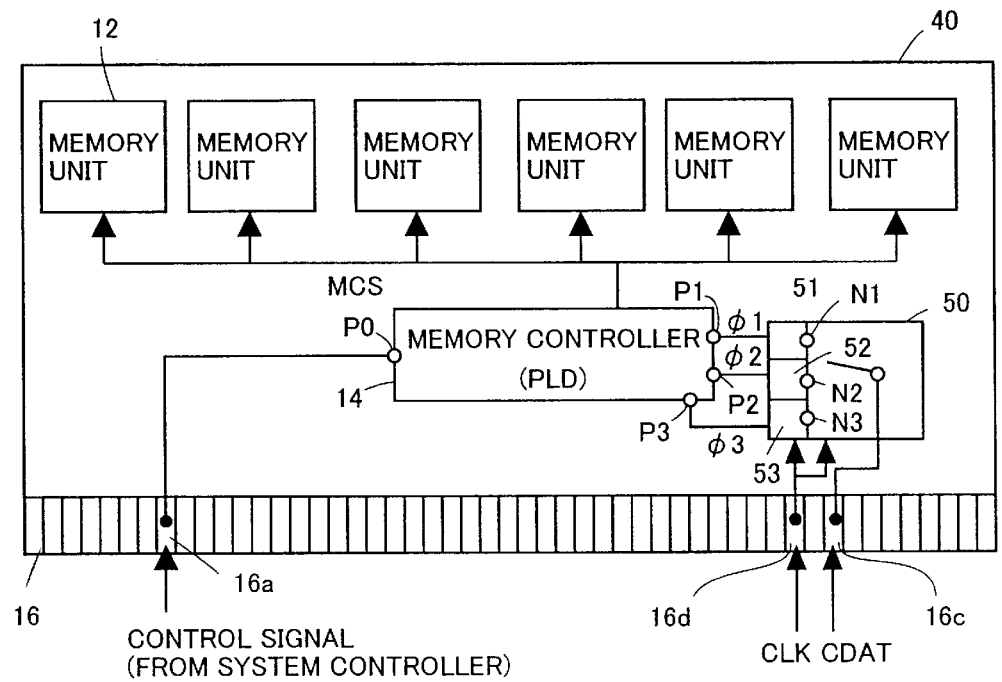
FIG. 6 is a schematic block diagram showing an overall configuration of a memory module according to a variation of a third embodiment.

Referring to FIG. 6, a memory module 40 according to the variation of the third embodiment is different from the memory module 10 shown in FIG. 1 in that it further includes a selector circuit 50 and data registers 51, 52, and 53. Since the configuration of the other portions is similar to that of the memory module 10 in FIG. 1, detailed description is not repeated.

In FIG. 6, the frequency characteristic of the noise filter mounted on the first stage circuit of the memory controller 14 is adjusted stepwise, for example, by three electric signals $\phi1$ to $\phi3$.

The electric signals $\phi1$ to $\phi3$ are input from the outside of the memory module (system controller) to the connector terminal 16c as a data signal CDAT that has a serial data string. A clock signal CLK that repeats "H" and "L" levels in a certain cycle is also input to the connector terminal 16d.

The selector circuit 50, in response to the clock signal CLK, selects one of the nodes N1 to N3 in turn to connects the same to the connector terminal 16c. Each of the data registers 51 to 53 latches the data input to corresponding one of the nodes N1 to N3 at the timing responding to the clock signal CLK.

For example, the data register 51 latches the data signal CDAT transmitted to the node N1 as an electric signal $\phi1$ and outputs it to the input pin P1 of the memory controller 14. Similarly, the data register 52 latches the data signal CDAT transmitted to the node N2 as an electric signal $\phi2$ and outputs it to the input pin P2 of the memory controller 14. The data register 53 latches the data signal CDAT transmitted to the node N3 as an electric signal 43 and outputs it to the input pin P3 of the memory controller 14.

Next, a configuration of the data registers will be described. Since each of the data registers 51 to 53 has the same configuration, the configuration of the data register 51 is representatively described with reference to FIG. 7.

Figure 7:
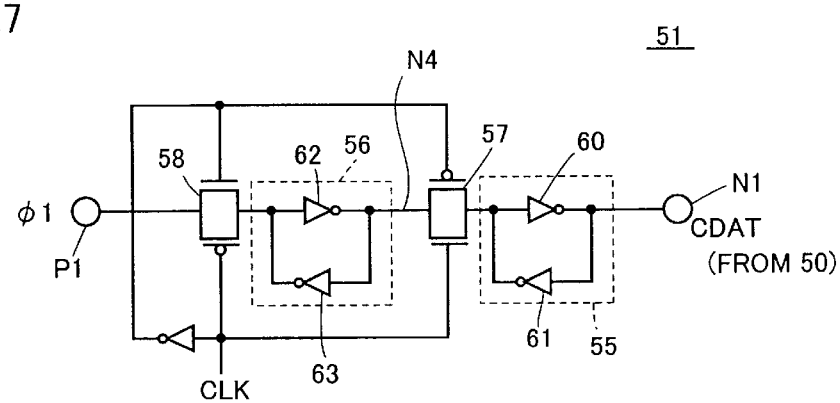
FIG. 7 is a circuit diagram showing a configuration of a data register illustrated in FIG. 6.

FIG. 7 is a circuit diagram showing the configuration of the data register 51.

Referring to FIG. 7, the data register 51 has latch circuits 55 and 56, and transfer gates 57 and 58. The latch circuit 55 has circulatively connected inverters 60 and 61, and the latch circuit 56 has circulatively connected inverters 62 and 63.

The latch circuits 55 latches the data signal CDAT transmitted to the node N1. The transfer gate 57 turns on in the period when the clock signal CLK is at "H" level to transmit the data retained in the latch circuit 55 to the node N4. The latch circuit 56 latches the data transmitted to the node N4. The transfer gate 58 turns on in the period when the clock signal is at "L" level to transmit the retained data in the latch circuit 56 to the input pin P1.

With such configuration, each of the data registers 51 to 53 is capable of taking in and latching the data signal CDAT transmitted to corresponding one of the nodes N1 to N3, as well as transmitting the latched data signal to the input pins P1 to P3 as electric signals $\phi1$ to $\phi3$, respectively.

As has been described, by inputting the electric signals for adjusting the frequency characteristic of the noise filter as the data signal CDAT having serial data strings, the number of the connector terminals required for inputting such electric signals is reduced compared to the configuration according to the third embodiment.

Further, in the first to the third embodiments and the variation thereof, while the configuration in which the frequency characteristic of a noise filter is adjusted stepwise using two or three electric signals has been described, the number of the electric signals used is not limited as is in the examples and optional numbers of electric signals can be used to adjust similarly the frequency characteristic of the noise filter.

Additionally, while the configurations in which the low pass filter is applied as a noise filter provided in the input first stage circuit of the memory controller (PLD) have been shown as examples, filter circuits in other forms having desired frequency characteristic such as a band pass filter may be applied alternatively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
    a plurality of connector terminals for externally sending and receiving signals;
    a plurality of internal circuits; and
    a control circuit for controlling an operation of said plurality of internal circuits based on a prescribed logic operation responding to a control signal input to one of said plurality of connector terminals,
    said control circuit includes
        a first pin terminal receiving input of said control signal,
        a second pin terminal receiving an input of an electric signal,
        a filter circuit attenuating components superposed onto the signal input to said first pin terminal in a prescribed frequency range that varies depending on said electric signal input to said second pin terminal, and
        a logic operation circuit for executing said prescribed logic operation in response to the control signal having passed said filter circuit.

2. The semiconductor integrated circuit device according to claim 1, wherein
    said control circuit is configured with a programmable logic device.

3. The semiconductor integrated circuit device according to claim 1, wherein
    each of said internal circuits is a memory unit capable of inputting or outputting data independent of each other, and
    said semiconductor integrated circuit device is a memory module.

4. The semiconductor integrated circuit device according to claim 1, wherein
    said second pin terminal is coupled to a prescribed voltage in said semiconductor integrated circuit device.

5. The semiconductor integrated circuit device according to claim 1, further comprising a storage unit for storing data, in a non-volatile manner, provided to said second pin terminal as said electric signal.

6. The semiconductor integrated circuit device according to claim 1, wherein
    said electric signal is input from the outside of said semiconductor circuit device via another one of said plurality of connector terminals, and
    said second pin terminal is electrically coupled to said another one of the connector terminals.

7. The semiconductor integrated circuit device according to claim 1, wherein
    said electric signal and said second pin terminal are provided each N in number (where N is an integer not smaller than 2), and
    N said data signals are input to said another one of the plurality of connector terminals as a serial data string;
    said semiconductor integrated circuit device further comprising:
        N data registers provided between first to Nth internal nodes and N of said second pin terminals, and
        a selector circuit for electrically coupling one of said first to Nth internal nodes selected in turn to said another one of connector terminals; wherein
        each of said N data registers retains a data signal transmitted to corresponding one of said first to Nth internal nodes as well as outputting the retained data signal to corresponding second pin terminal as said electric signal.

8. The semiconductor integrated circuit device according to claim 1, wherein said filter circuit has:
    a resistance component capable of switching resistance value step wise depending on said electric signal of digital signal; and
    a capacitive component;
    wherein cutoff frequency of said filter circuit changes depending on a product of a value of said resistance component and a value of said capacity component.

9. The semiconductor integrated circuit device according to claim 1, wherein said filter circuit has:
    a resistance component; and
    a capacitive component capable of switching the capacitance value stepwise depending on said electric signal of digital signal;
    wherein cutoff frequency of said filter circuit changes depending on a product of a value of said resistance component and a value of said capacity component.

* * * * *